United States Patent
Neidich et al.

(12) 
(10) Patent No.: US 6,607,120 B1
(45) Date of Patent: Aug. 19, 2003

(54) METHOD OF MANUFACTURING A FLEXIBLE CIRCUIT COMPRESSION CONNECTOR

(75) Inventors: Douglas A. Neidich, Harrisburg, PA (US); Grant R. Adams, Jr., Enola, PA (US)

(73) Assignee: InterCon Systems, Inc., Harrisburg, PA (US)

(*) Notice: Subject to any disclaimer, the term of this patent is extended or adjusted under 35 U.S.C. 154(b) by 0 days.

(21) Appl. No.: 09/470,785

(22) Filed: Dec. 23, 1999

Related U.S. Application Data

(60) Division of application No. 09/239,891, filed on Jan. 28, 1999, now Pat. No. 6,036,502, which is a continuation-in-part of application No. 08/963,401, filed on Nov. 3, 1997, now Pat. No. 5,899,757.

(51) Int. Cl.[7] .............................................. B23K 31/02
(52) U.S. Cl. .................................. 228/180.22; 228/212
(58) Field of Search .............................. 439/67, 74, 77, 439/492, 86; 228/180.22, 210, 212, 213

(56) References Cited

U.S. PATENT DOCUMENTS

| 4,184,729 A | * | 1/1980 | Parks et al. .................... 29/830 |
| 4,442,938 A | | 4/1984 | Murphy ....................... 206/329 |
| 5,059,129 A | | 10/1991 | Brodsky et al. ............... 439/67 |
| 5,118,299 A | | 6/1992 | Burns et al. ................... 439/74 |
| 5,533,904 A | * | 7/1996 | Nobel et al. ................. 439/493 |
| 5,575,662 A | | 11/1996 | Yamamoto et al. ........... 439/67 |
| 6,375,475 B1 | * | 4/2002 | Brodsky ....................... 439/66 |

OTHER PUBLICATIONS

Packard–Hughes Advertisement "Gold Dot Technology: High Performance Electronic Interconnections." 1995.

* cited by examiner

Primary Examiner—Tom Dunn
Assistant Examiner—Jonathan Johnson
(74) Attorney, Agent, or Firm—Carmen Santa Maria; McNees Wallace & Nurick LLC

(57) ABSTRACT

A flexible circuit compression connector system utilized to electrically connect together conductive pads disposed on a rigid printed circuit board, the connector system comprising a flexible insulating substrate having conductive material at a plurality of preselected positions and a conductive line extending between at least two of the preselected positions, a plurality of contacts, each contract secured to the flexible substrate at each of the preselected positions having conductive material, a compression assembly that includes a resilient compression mat and means for aligning the flexible substrate of the compression assembly and the rigid substrate together so that the resilient compression mat urges the contacts secured to the flexible substrate against the conductive pads on the printed circuit board. A method of manufacturing the flexible circuit compression connector system that includes a compression assembly by forming the contacts into a preselected configuration and securing the contacts to the flexible substrate is also included.

12 Claims, 15 Drawing Sheets

METHOD OF MANUFACTURING A FLEXIBLE CIRCUIT COMPRESSION CONNECTOR

CROSS REFERENCE TO RELATED APPLICATIONS

The present application is a divisional of U.S. patent application Ser. No. 09/239,891 now U.S. Pat. No. 6,036,502 filed Jan. 28, 1999, which is a continuation-in-part of pending U.S. patent application Ser. No. 08/963,401 now U.S. Pat. No. 5,899,757 filed Nov. 3, 1997 entitled "COMPRESSION CONNECTOR".

BACKGROUND OF THE INVENTION

1. Field of the Invention

This invention relates to electrical connectors and, more particularly, to high density electrical connectors utilized to electrically connect electronic devices disposed on two or more printed circuit boards.

2. Description of the Prior Art

Increased integration of electronic devices has created an interconnection problem for printed circuit boards receiving these devices. Specifically, the number of interconnections required to electrically connect together two or more printed circuit boards receiving these electronic devices has exceeded the connection densities of prior art pin-in-socket connectors. Moreover, these prior art pin-in-socket connectors typically have relatively long and unshielded lengths which have uncontrolled impedances resulting in less than desired electrical performance.

A high contact density connector utilizable for electrically connecting together electronic devices received on two or more printed circuit boards and overcoming the foregoing problems is disclosed in an article entitled "A High Density Edge Connector" by J. Campbell et al., Copyright 1995 IEEE. This article discloses a flex circuit formed of a 2 mil thick polyamide film having 3 mil wide copper lines plated onto one side thereof and 25 mil round contact pads plated on the side of the film opposite the circuit lines and along both edges of the film. 4 mil diameter plated through-holes, or vias, extend between the contact pads on one side of the film and the circuit lines on the other side. Palladium dendrites, or spires, are electro-deposited on surfaces of each contact pad. These dendrites straddle dust or fibers and puncture oils or films present on each contact pad prior to connector mating and produce on each contact pad a multitude of conductive connections. The connector includes a molded plastic force block to which elastomeric cylinders are molded. These cylinders act as springs which provide force, when compressed during assembly, to make and maintain an electrical connection between the contact pads on the film and the pads on a printed circuit board. One cylinder is provided for each contact and compensates for any variation in planarity and tolerance accumulation. Conical alignment pins are utilized to mate alignment holes in the flex circuit with alignment holes in the printed circuit board during assembly, thereby ensuring proper registration between the contact pads on the film and the pads on the printed circuit board.

Another flexible circuit connector for connecting a daughter card and a mother board is disclosed in an article entitled "A High Density Pad-On-Pad Connector Utilizing A Flexible Circuit" by R. S. Pokrzywa, Copyright 1993 IEEE. This connector utilizes a two-sided flex circuit having plated, spherical contacts contacting flat printed circuit pads on the daughter card and on the mother board. The spherical contacts on the flex circuit are 5 mils in diameter and have a copper base metal overplated with nickel and gold. Alignment pins are utilized to align the flex circuit, the daughter card and the mother board so that each spherical contact mates with a desired printed circuit pad. Precipitation hardened stainless steel curved beams provide contact force for reliable connection between the spherical contacts and the printed circuit pads. During actuation, the curved beam is flattened to produce a uniform load across the contact area. An elastomeric pad is positioned between the beam and the contact area to accommodate local discrepancies in load across the contact area and to focus the connector forces. In one embodiment, the elastomeric pad has a plurality of elastomeric cylinders utilized to back-up the spherical contacts. In another embodiment, where size does not permit molding individual cylinders for each spherical contact, an elastomeric rib is utilized to back a row of spherical contacts.

A problem with spherical contact pads and electrodeposited dendrites on contact pads is that they inconsistently break through contaminants, such as oxides, films or foreign materials, that may be present thereon or on the contact pad of a printed circuit board. Hence, inadequate electrical contact or, in some instances, no electrical contact is made between the contact pad of the flexible circuit and the contact pad of the printed circuit board. Moreover, the formation of a geometric surface such as dendrites or spheres on the contacts of the flexible circuit increases the cost of such connectors.

Currently available flexible circuits are expensive to manufacture and must be designed for specific applications. What is desired is a flexible electrical connector device that includes a compression means, yet is adaptable to different applications and is inexpensive to manufacture.

It is therefore an object the present invention to provide a flexible circuit compressor connector system that includes a compression assembly device which overcomes these drawbacks of the prior art connectors. It is a further object of the present invention to provide a flexible circuit compression connector system contact that promotes electrical contact with conductive pads of a printed circuit board tailored to specific applications. It is an object of the present invention to provide a method for making a flexible circuit compression connector system that utilizes a resilient compression assembly device to provide the required contact. It is an object of the present invention to provide a method of making a flexible circuit compression connector system that includes a resilient compression assembly that is less costly to manufacture than the prior art flex circuit connectors and is easy to assemble and align.

SUMMARY OF THE INVENTION

Accordingly, we have invented a flexible circuit compression connector system that includes a compression assembly utilized to electrically connect together conductive pads disposed on one or more substrates. The flexible circuit compression connector system includes a flexible insulating substrate having a plurality of predetermined positions of preapplied conductive material and at least one conductive line thereon extending between at least two of the predetermined positions of preapplied conductive material, such as a solder paste. The system also includes a plurality of contacts of preselected configuration forming a matrix which are assembled to the substrate. Each contact has a head and a base secured to the flexible insulating substrate at the predetermined positions of conductive material, thereby forming a contact matrix. The base and head are conductive materials. Each contact in the matrix has a head of preselected configuration extending away from the base and the flexible substrate. Each contact is conductive so as to allow a flow of current through the preapplied conductive material on the substrate and the base through the preselected configuration of the contact. In one configuration, the flexible circuit compression connector system includes a flexible substrate having a plurality of conductive holes therein and at least one conductive line thereon extending between at least two of the conductive holes. The flexible circuit compression connector system also includes a plurality of contacts. Each contact includes a base and a head that extends away from the base. Optionally the base may include a post that extends away from the base in a direction opposite the head. The base or the optional post of each contact is secured in one of the plurality of conductive holes.

A compression mat is positioned on the side of the flexible substrate opposite the heads of the plurality of contacts. The compression mat includes a plurality of resilient cylinders extending away from a resilient base. Each resilient cylinder has a distal end alignable with each one of the plurality of contacts, but on the side of the flexible substrate opposite the contact heads.

In assembling the contacts to the flexible substrate, a transfer film is utilized to transfer the plurality of contacts to the flexible substrate. The disposable transfer film preferably has a plurality of elastically deformable receiving apertures which receive and secure the head portion of preselected configuration of the plurality of contacts.

A flexible cable assembly is attached to a first substrate, such as a rigid printed circuit board, which has a plurality of the conductive pads on a surface thereof and at least one conductive line connected to at least one of the conductive pads. The rigid substrate and the flexible circuit compression connector system are alignable so that a portion of the head of each contact on one end of the flexible substrate is aligned in registration with one of the conductive pads on the surface of the rigid substrate.

A means for compressing the compression mat against the contacts is positionable adjacent the resilient base of the compression mat. The means for compressing urges together at least a portion of the head of each contact on one end of the flexible cable to the conductive pad of the printed circuit board or assembly in registration therewith. The resilient columns of the compression mat contact the side of the flexible substrate opposite the heads of the contact matrix of the flexible substrate so that each resilient column is aligned opposite a contact of the contact matrix. The resilient columns act as springs when compressed and urge the contact heads on the contact matrix of the flexible substrate against the conductive pads on the surface of the mating assembly, typically the rigid substrate such as a printed circuit board. In an alternative configuration, each resilient column of the compression mat contacts the distal end of an optional post of a contact, the post extending through the flexible substrate and functions as the spring when compressed to make and maintain good electrical connection between the contact head and corresponding conductive pad.

Preferably, a plurality of alignment holes in each of the flexible substrate, the rigid substrate and a surface that includes the compression mat co-act with plurality of alignment members to align the flexible substrate, the rigid substrate and the compression mat so that the resilient cylinders are in registration with the contacts, and the heads of the plurality of contacts are in registration with the plurality of conductive pads. Each alignment member may be threaded and may serve the dual purpose of producing the compressive force for compressing the mat against the flexible substrate opposite the heads.

The present invention is a flexible circuit compression connector system comprised of at least one contact that includes a conductive head and a conductive base. The conductive head extends from one side of the base and is of a preselected design most suitable for its intended application. An optional post may extend from the side of the base opposite the head.

The base of the contact is secured to the flexible substrate at predetermined positions with a conductive material such as solder while a preformed head of preselected configuration extends away from the base. In an alternative configuration, the side of the base opposite the post can have a cavity formed therein in registration with a lengthwise axis of the post. The base can have a periphery having a generally rectangular outline. Each corner of the generally rectangular outline of the base can be rounded and can include one of the plurality of projections. Each projection can have a rounded edge formed continuous with the periphery of the base.

The present invention includes a method of making a flexible circuit compression connector system that includes a compression assembly having a connector that includes providing a plurality of contacts forming a matrix, each contact having at least a base and a head of preselected configuration selected on the basis of its intended application, the head projecting away from the base. The contacts are preformed by a metal working operation into any suitable preselected head geometry, the contacts being connected together by ribs. The heads of the plurality of contacts are inserted into a plurality of receiving apertures in a thin transfer film which captures the contacts so that the heads project through one side of the transfer film while a portion of the contacts are projected from the opposite side of the film. Thin ribs connecting the contacts are then separated from the contacts. A flexible insulating substrate is provided with preapplied conductive material applied at a plurality of predetermined positions. At least one conductive line extends between and electrically connects at least two of the predetermined positions of preapplied conductive material. The transfer film containing the contacts and the flexible substrate are mated by bringing the side of the transfer film having the portion of the contacts projecting from the transfer film opposite the heads into registry with the preapplied conductive material on the flexible substrate. This portion may be bases or optional posts. By application of heat, the contacts are fused to the preapplied conductive material on the flexible substrate. The transfer film is then separated from the flexible substrate so that the heads of the contacts project away from the surface of one side of the flexible substrate.

In the alternative configuration, a method of making the flexible circuit compression connector system that included a connector that includes providing a plurality of contacts, each contact having a base with a post and a head. The heads of the plurality of contacts are inserted into a plurality of receiving apertures in a disposable transfer film so that a portion of the post connected to the base opposite the head extends out of the plurality of receiving apertures. A flexible substrate is provided having a plurality of through-holes therein and a plurality of conductive lines thereon. At least one conductive line extends between and electrically connects at least two of the through-holes into which the conductive bases are inserted. The through-holes preferably are conductive. The transfer film and the flexible substrate are mated so that at least a portion of each base of the plurality of contacts are received in the plurality of conductive through-holes in the flexible substrate. The portion of the bases, which may be the aforementioned posts, of the plurality of contacts are fused to the plurality of through-holes in the flexible substrate. The transfer film is then separated from the flexible substrate and the plurality of contacts.

The plurality of contacts are formed from a strip of conductive material by any conventional metal forming method. Each contact is connected to an adjacent contact by a rib formed from the conductive material strip during the metal forming operation. Each contact is excised from its connecting rib after insertion into one of the receiving apertures in the transfer film. Each receiving aperture elastically deforms to receive and retain the contact therein.

An advantage of the present invention is that it provides a flexible cable including a compression assembly which overcomes the drawbacks of the prior art connectors. The present invention provides a flexible circuit compression connector system having a compression assembly that includes an electrical connector that utilizes the compression assembly to promote positive contact between the connector and the conductive pads of a mating circuit. The present invention also provides an improved method for making a flexible circuit compression connector system that utilizes the provided compression assembly to assure positive contact with a mating assembly. The present invention also provides a method of making a flexible electrical cable and connector that is easier, more reliable, more readily adaptable to modifications, including field modifications, and less costly to manufacture than the prior art flex circuit connectors.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIG. 2b is a side view of the compression mat of FIG. 2a;

FIG. 5b is an enlarged view of the flexible circuit compression connector system connected to a rigid circuit board of FIG. 5a;

FIG. 10 is a cross section of the contacts of the conductive strip of FIG. 7a received in receiving apertures of the transfer film of FIG. 9a after excising ribs and positioned in alignment with through-holes formed in the flexible substrate of FIG. 3a;

DESCRIPTION OF THE PREFERRED EMBODIMENT

Figure 1A:
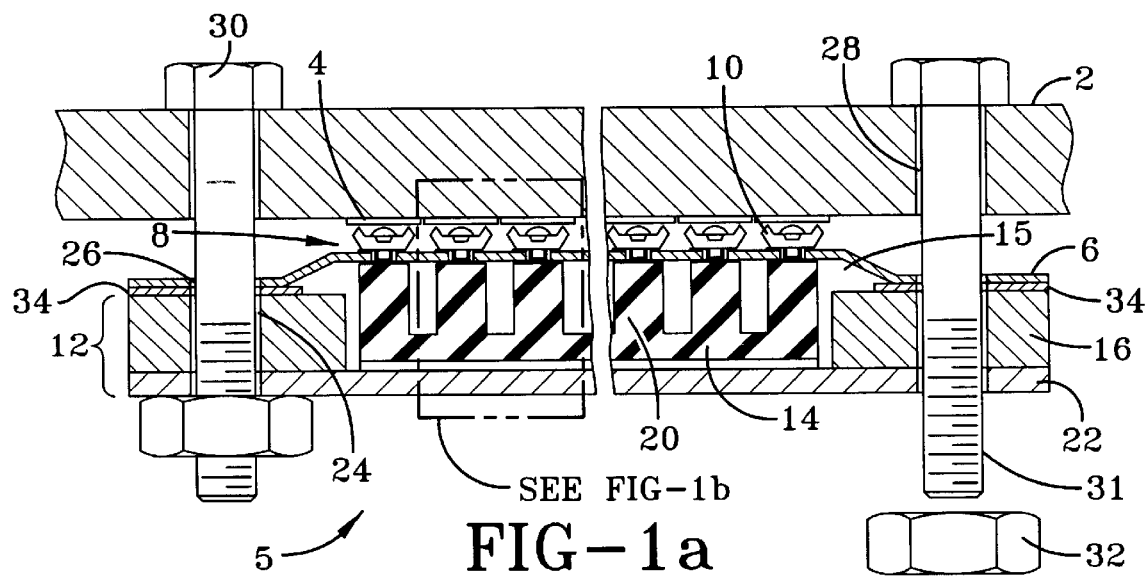
FIG. 1a is a cross section of one embodiment of a flexible circuit compression connector system in accordance with the present invention.
Figure 1B:
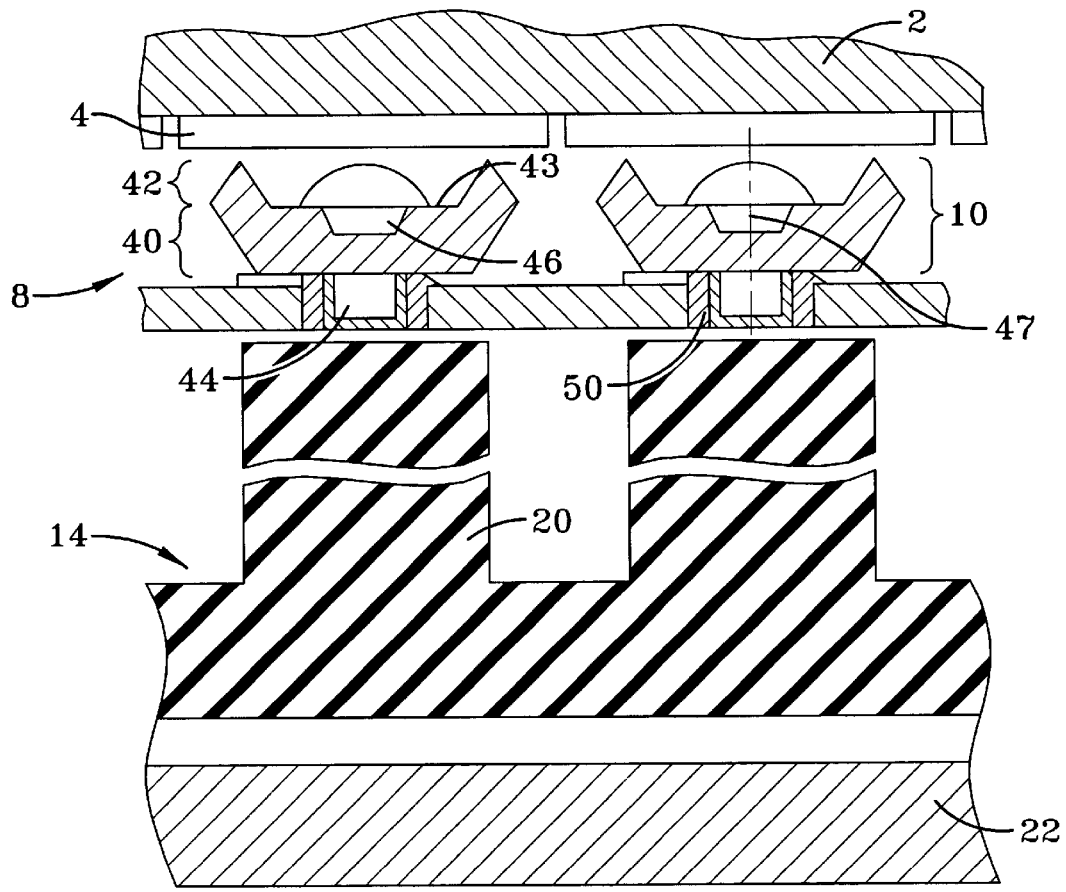
FIG. 1b is an enlarged view of a portion of FIG. 1a within rectangle 1b.

Referring to FIGS. 1a–1b, a rigid substrate 2, such as a rigid printed circuit board formed of FR-4 or ceramic, has a plurality of conductive pads 4 formed thereon in a manner known in the art. The rigid substrate 2 may include one or more conductive lines that extend between one or more of the conductive pads 4 or between a conductive pad 4 and an electronic device connected to the rigid substrate 2. The conductive lines and electronic device are not shown on the rigid substrate 2 in FIG. 1 for simplicity of illustration.

A flexible circuit compression connector system 5 comprised of a flexible insulating substrate 6 having a plurality of contacts 8 secured thereon is positioned adjacent the rigid substrate 2. The flexible substrate 6 is preferably formed of a polyimide film such as Kapton® or Mylar. Kapton® is a registered trademark of E.I. DuPont DeNemours & Company. The contacts 8 are secured to the flexible substrate 6 in a pattern matching the pattern of the conductive pads 4 on the rigid substrate 2. Each contact 8 includes a head 10 that extends away from a surface of the flexible substrate 6. Aligning the flexible substrate 6 and the rigid substrate 2 positions the heads 10 of the flexible substrate 6 in registration with the conductive pads 4 of rigid substrate 2.

Figure 2A:
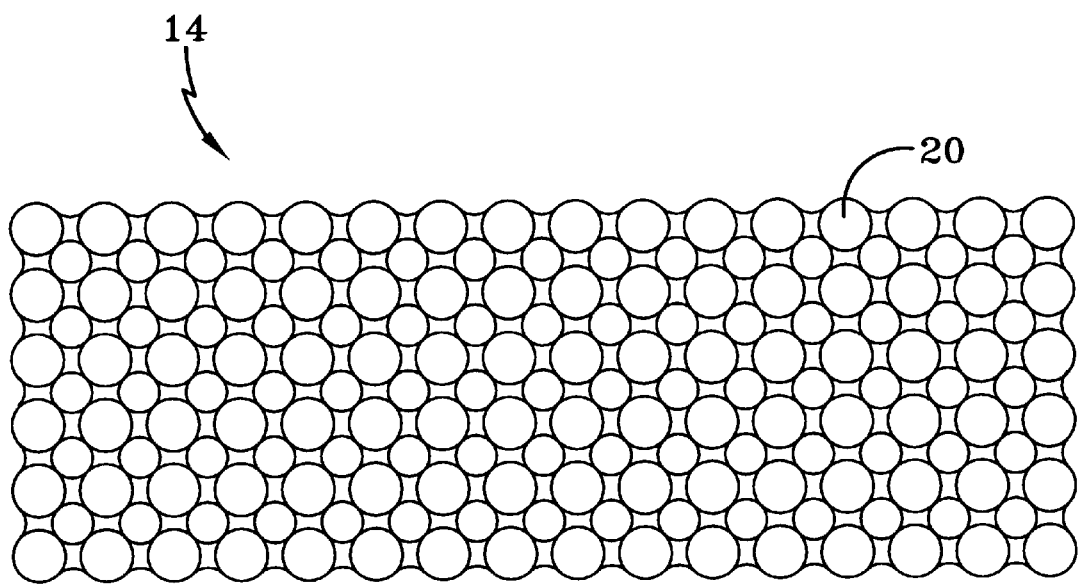
FIG. 2a is a plan view of a compression mat of the compression assembly in FIG. 1.
Figure 2B:
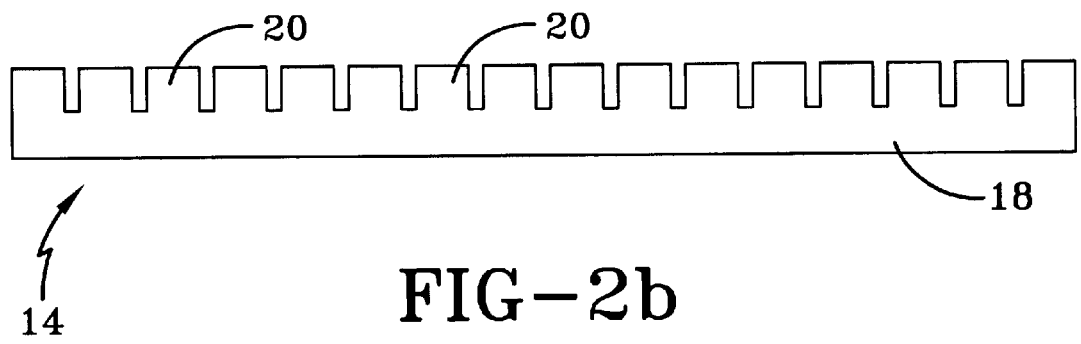

In accordance with one embodiment of the present invention shown in FIG. 1a, a compression assembly 12 is positioned on the side of the flexible substrate 6 opposite the heads 10 of the contacts 8 to form the flexible circuit compression connector system 5. The compression assembly 12 includes a compression mat 14 received in an aperture 15 of an alignment sleeve 16. As shown in FIGS. 2a–2b, the compression mat 14 includes a base 18, preferably having a generally rectangular outline, and a plurality of resilient cylinders 20 extending from the base 18. The compression mat 14 and the flexible substrate 6 are positioned so that distal ends of the resilient cylinders 20 are aligned in registration with the contacts 8 on a surface of the flexible substrate 6 opposite the heads 10. The compression assembly 12 further includes a washer 22 positioned on a side of the alignment sleeve 16 adjacent the base 18 of the compression mat 14. Although the alignment sleeve and washer may be a single element, preferably, the compression mat 14, the alignment sleeve 16 is formed from a polyphenylene sulfide, UL 94 V-O, the washer 22 is formed from stainless steel and the compression mat 14 is formed of a thermal silicon rubber.

The compression assembly 12, flexible substrate 6 and the rigid substrate 2 each have a plurality of alignment apertures 24, 26 and 28, respectively. In the arrangement shown in FIG. 1a, the apertures extend through the compression assembly, the flexible substrate and the rigid substrate. Each alignment aperture 24, 26 and 28 is adapted to receive a shaft of an alignment member 30, such as a bolt having an externally threaded end 31 adapted to mate with internal threads of a nut 32. Applying the nuts 32 to the threaded portion of alignment members 30 urges together the compression assembly 12, the flexible substrate 6 and the rigid substrate 2. This urging together forces into contact the conductive pads 4 and the heads 10 in registration therewith, and the distal ends of the resilient cylinders 20 in registration with contacts 8 on the surface of the flexible substrate 6 opposite the heads 10. Continued tightening of nuts 32 to the threaded ends of alignment members 30 compresses the compression mat 14 between the flexible substrate 6 and the washer 22. This compression causes the resilient cylinders 20 to deform elastically against the contacts 8 on the side of flexible substrate 6 opposite heads 10. This deformation causes each resilient cylinder 20 to apply a spring force to the head 10 and thus to the conductive pad 4 in registration therewith. This spring force between the head 10 and the conductive pad 4 in registration therewith provides the basis for formation and maintenance of good electrical contact, while compensating for any variations in planarity and tolerance accumulation. In the embodiment shown in FIG. 1a, preferably, double-sided tape 34 is utilized to adhere together adjacent surface of flexible substrate 6 and the sides of the alignment sleeve 16. Flexible substrate 6, however, may be attached to compression assembly 12 by any means suitable to form flexible circuit compression connector system 5.

In the configuration shown in FIGS. 1a and 1b, head 10 of each contact 8 has a base 40 and a plurality of projections 42 disposed around a periphery 43 of the base 40. The projections 42 extend to one side of the base 40 and give the head 10 a crown-shaped appearance. Each contact 8 also has a post 44 that extends from a central part of the base 40 opposite the projections 42. A cavity 46 is formed in each base 40 opposite the post 44 and in alignment with a lengthwise axis 47 of the post 44.

Although projections 42 in the configuration shown in FIGS. 1a and 1b provide head 10 with a crown shaped appearance, each contact 8 has a base 40 and a head 10 of preselected configuration. The configuration of the head 10 is not limited to the crown shaped configuration depicted in FIGS. 1a and 1b. Heads 10 may be of any preselected configuration, and as will be become apparent, may vary from position to position on any flexible circuit compression connector system, if so desired. Regardless of head configuration, as should be clear to one skilled in the art, contact 8 may assume any form or combination of forms in which the contact has at least a base 40 and a head 10 extending away from base 40. Preferably, head 10 of each contact 8 extends away from the base 40 when assembled to flexible substrate on the side of the base 40 opposite flexible substrate 6. Each contact 8 is secured to flexible substrate 6 in a positive manner to assure a reliable current flow.

Figure 3A:
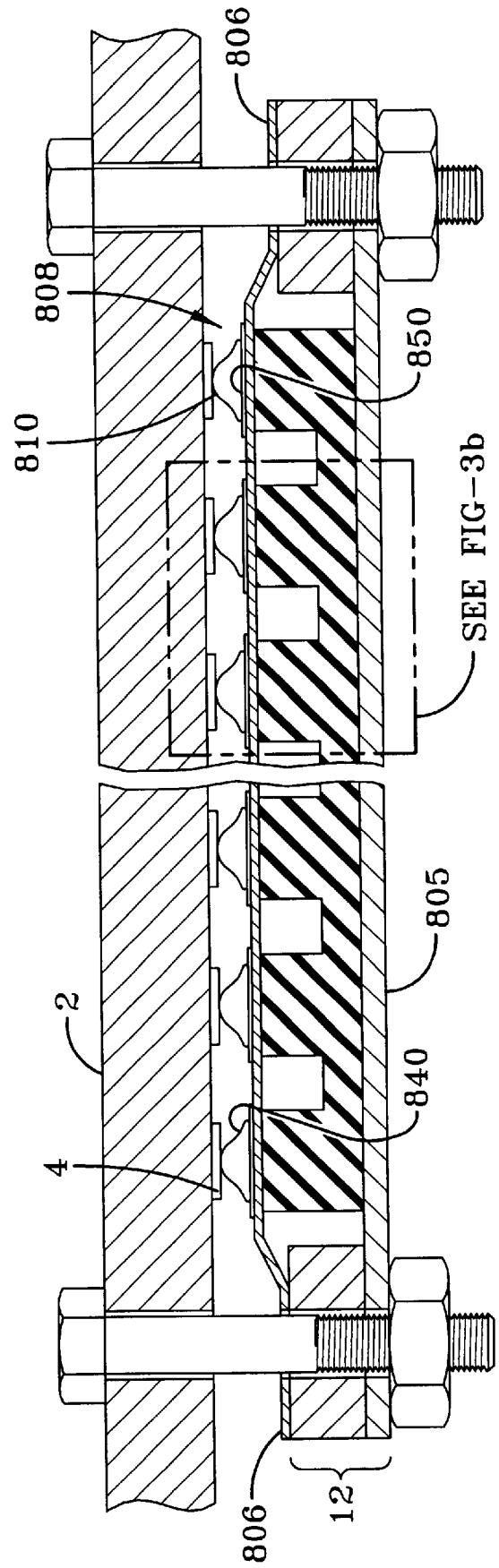
FIG. 3a is a cross-section of a second embodiment of a flexible circuit compression connector system in accordance with the present invention.
Figure 3B:
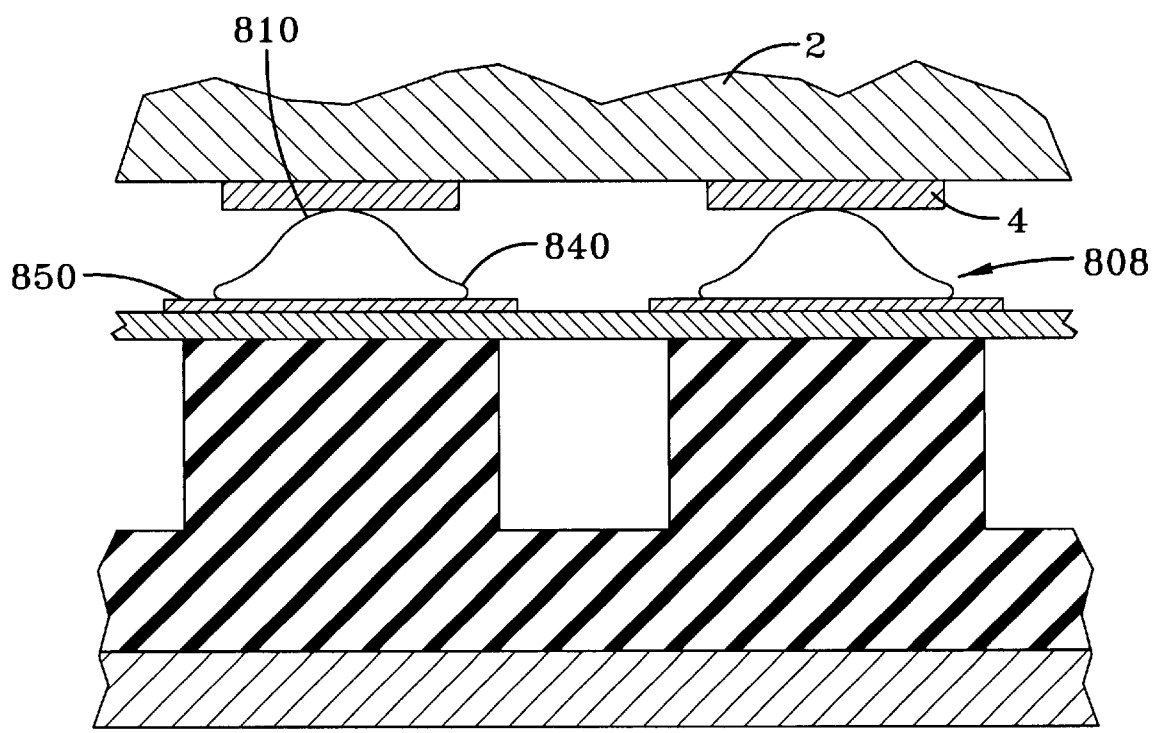
FIG. 3b is a an enlarged view of a portion of FIG. 3a within rectangle 3b.
Figure 3C:
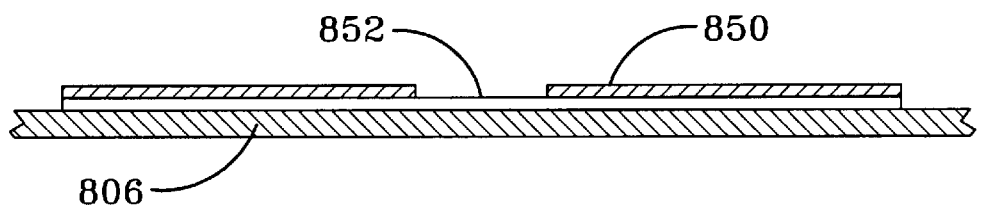
FIG. 3c is a cross-section of flexible substrate prior to attachment of contacts.

In a second embodiment of the flexible circuit compression connector system as shown in FIGS. 3a, 3b, and 3c, flexible substrate 806 is a planar body of substantially uniform thickness, as shown. It will be understood that the thickness of substrate 806 may be varied as needed. A conductive metallic material 850, such as solder, is preapplied to the flexible substrate 806 at preselected positions corresponding to required conductive pads 4 on rigid substrate 2. Conductive metallic material 850 is preferably connected to at least one conductive line 852 or to one or more conductive ground planes (not shown) formed on the flexible substrate surface that extends between at least 2 of the preselected positions as shown in FIG. 3c. In this embodiment, the one or more conductive ground planes are formed on the same surface of the flexible substrate as the conductive line. Such conductive ground planes reduce or eliminate cross-talk between conductive lines and/or reduce or eliminate the effect on one or more of conductive lines 852 of electromagnetic interference from external sources. Furthermore, because conductive lines 852 and conductive ground planes are formed on one side of the flexible substrate 806, the possibility of metallic material extending through any apertures in the substrate to act as an electrical antenna and becoming a source of interference is eliminated. In this embodiment as shown in FIG. 3c prior to application of contacts 808, the circuitry on the flexible substrate is more dense and the application of conductive metallic material 850 such as solder must be better controlled than in the previous embodiment. It will be understood that while solder is the most cost effective material for this application, other conductive materials such as copper or its alloys may be applied by suitable techniques, such as plasma depositing, spraying, laser depositing, plating or any other suitable method. Flexible circuit compression connector system comprised of compression assembly 12 which is otherwise identical to compression assembly 12 depicted in FIGS. 1a and 1b, is assembled to flexible substrate 806 to form flexible circuit compression connector system 805.

Figure 4:
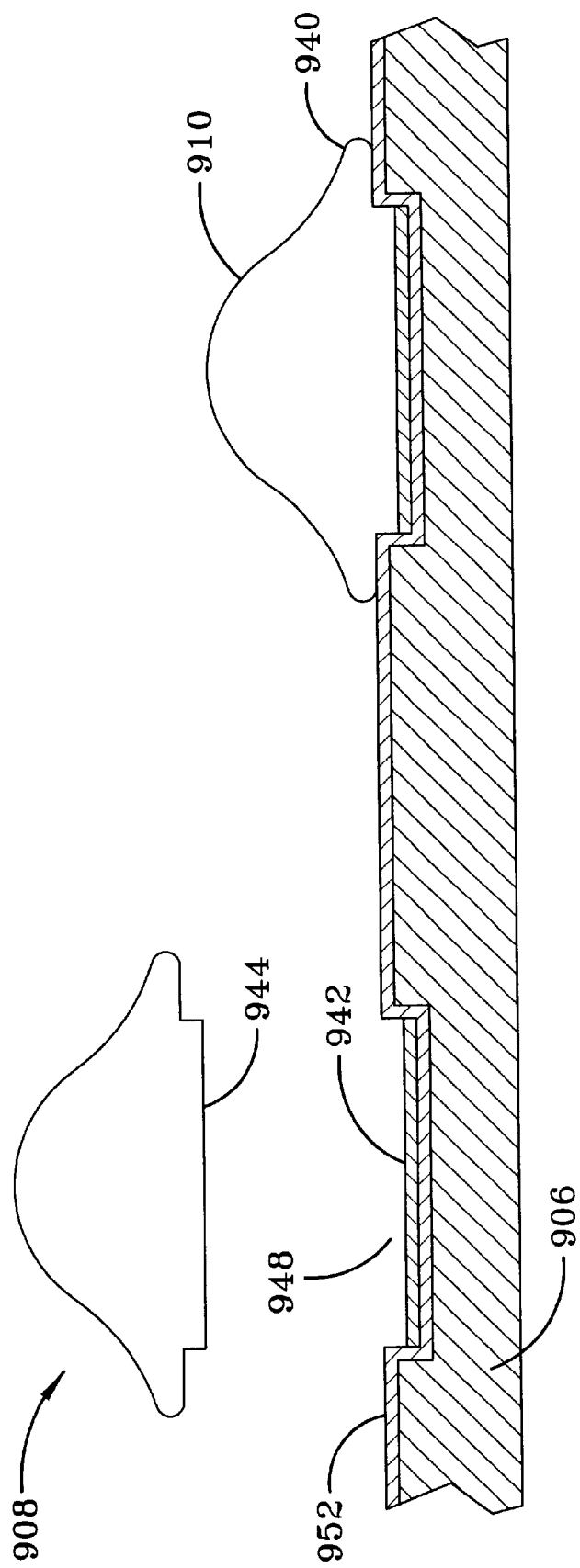
FIG. 4 is an exploded view of an embodiment of flexible substrate with an optional contact configuration.

In a variation of this embodiment of the invention as shown in FIG. 4, flexible substrate 906 includes cavities 948 or depressions at predetermined locations on its surface corresponding to contact pad positions 4 found on rigid substrate 2. Cavities 948 or depressions have a depth less than the thickness of flexible substrate 906. Conductive lines 952 or conductive ground planes (not shown) extend between at least two of the cavities 948 on the flexible substrate. In this embodiment, each contact 908 has a post 944, a base 940 and a head 910 of preselected configuration. Head 910 of each contact 908 extends away from the base 940 on the side of the base opposite the flexible substrate 906. Post 944 of each contact 908 is dimensioned to be about the same as the dimensions of the corresponding cavity 948 in the flexible substrate 906. It will be understood by those skilled in the art that the height of post 944 will closely correspond to the depth of cavity 948, while the lateral dimensions of each post 944 may be slightly larger than, identical to or slightly smaller than the dimensions of each cavity 948. The choice of the lateral dimensions will depend on the chosen method of securing contact 908 to substrate 906. For example, if an interference fit between the post 944 and the corresponding cavity 948 is desired, the post lateral dimension is slightly larger than the cavity dimension, and solder 942 is preapplied to the cavity. If liquid solder is to be flowed over the flexible substrate and into cavity 948, then the post dimension is slightly smaller than the cavity dimension so that the liquid solder can be introduced into the cavity, for example, by capillary action. It will be understood that a compression assembly such as is shown in FIG. 1a, 1b, 3a, or 3b or as will be described, is utilized in conjunction with flexible substrate 906 to form a flexible circuit compression connector system (not shown) to urge head 910 on the flexible substrate 906 into contact with conductive pads 4 of substrate 2.

Figure 5A:
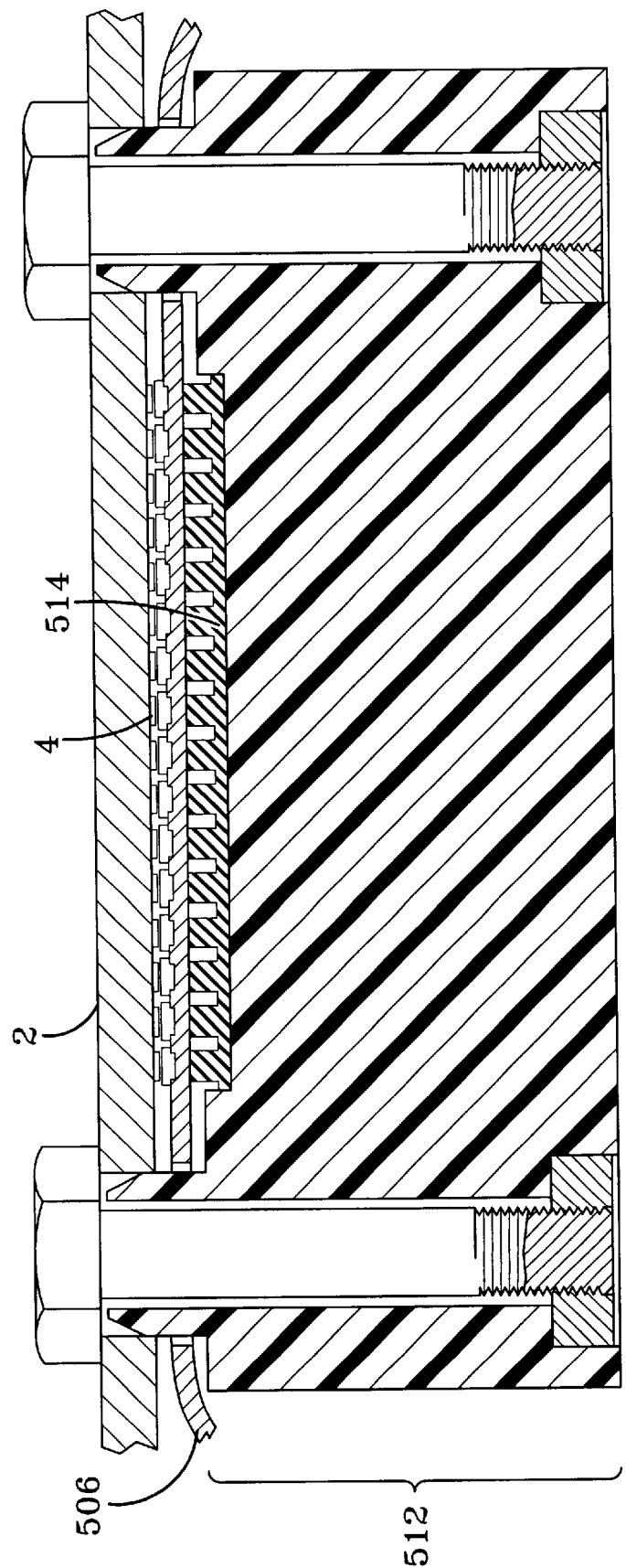
FIG. 5a is a cross-section of the preferred embodiment of the flexible circuit compression connector system of the present invention connected to a rigid circuit board.
Figure 5B:
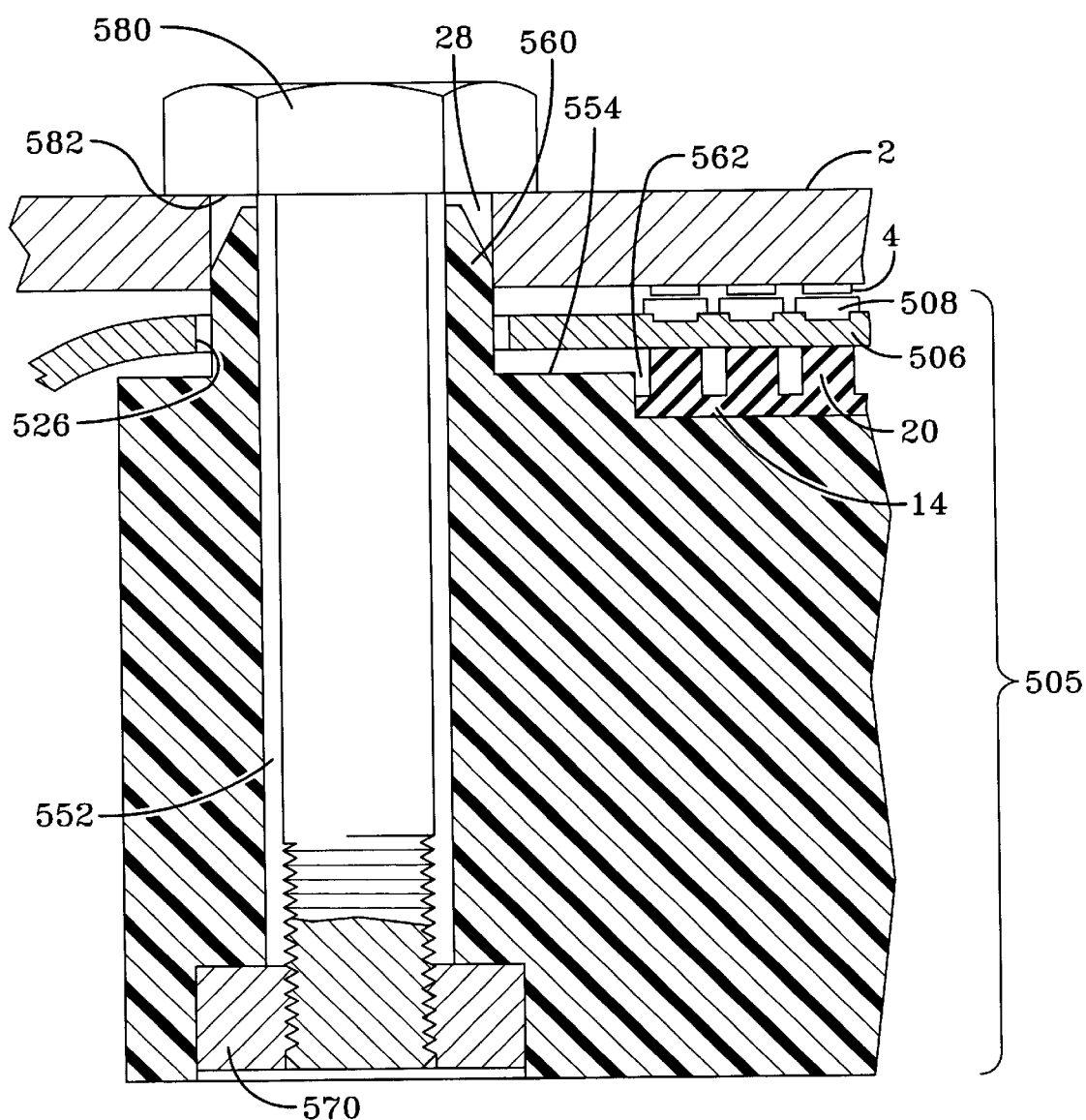
Figure 5C:
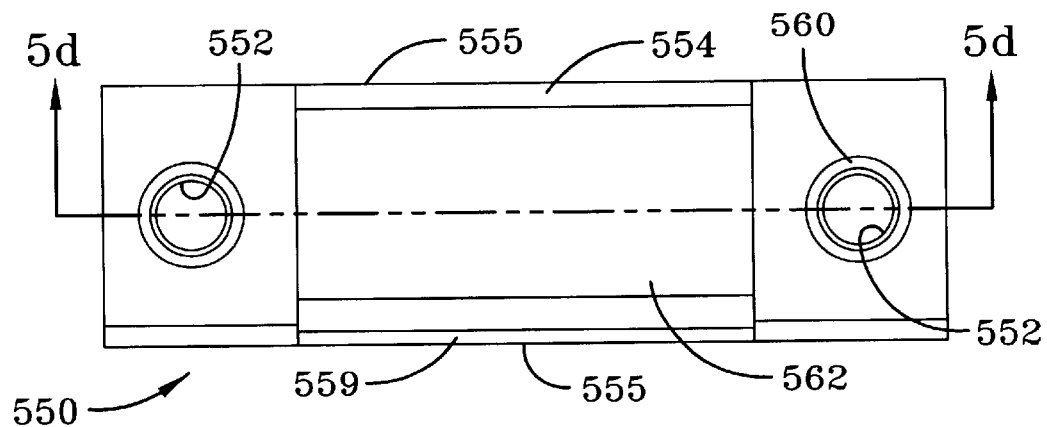
FIG. 5c is a plan view of a connector block of the compression assembly that forms part of the flexible circuit compression connector system of FIG. 5b.
Figure 5D:
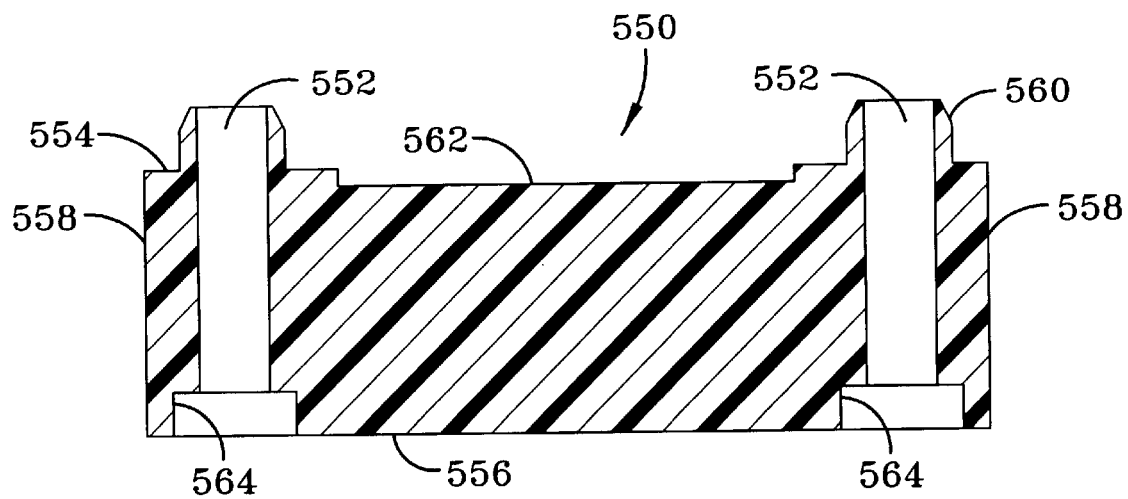
FIG. 5d is a cross-section of the connector block of FIG. 5c.

FIG. 5a depicts a preferred embodiment of the flexible circuit compression connector system of the present invention assembled to a rigid substrate 2 such as the circuit board as previously described. Rigid substrate 2 includes conductive pads 4, conductive lines (not shown) extending between on of more of conductive pads 4. A flexible circuit compression connector system 512 is comprised of a flexible insulating substrate 506, a connector block 550, and a resilient compression mat 14 having resilient compression cylinders 20. FIG. 5b an enlarged view of a portion of FIG. 5a. Resilient mat 14 is assembled onto connector block 550. A plan view of the preferred embodiment of connector block 550 is shown in FIG. 5c, and in cross section in FIG. 5d. Connector block 550 is made of an insulating material. The connector block itself may be made of a compressible nonconducting material, but in the embodiment shown, block 550 is made of a rigid material. While the connector block may be made from any low shrinkage thermoset or thermoplastic material that is readily moldable or workable into a shape having the desired features, the blocks are currently manufactured of polyphenylene-sulfide. Block 550 as shown is rectangular, but may be any acceptable shape. At least one aperture 552 extends through block 550. As shown in FIG. 5d, block 550 has a top surface 554, a bottom surface 556 and two end surfaces 558 and includes a pair of apertures 552. Two side surfaces 555 similar to top surface 554 run parallel to the plane of FIG. 5d and extend perpendicularly inward into the plane of FIG. 5c. Top surface 554 includes two extensions or lips 560 extending upward from top surface 554 that are coaxial with apertures 552. Between these lips 560 along top surface is a recess 562. Block 550 as depicted in FIG. 5c also includes optional chamfer 559 thereby eliminating a sharp corner that could serve as a stress riser for a flexible circuit. A chamfer or a radius (not shown) can be utilized on each edge to eliminate potential stress risers, if desired. Apertures 552 include counterbores 564 positioned along bottom surface 556. It will be understood that this counterbore may be positioned along top surface 554 or that a counterbore may be positioned at both ends of each aperture, these structures all being equivalent. Furthermore, a recess identical to recess 562 optionally may be included on each of side surfaces 555 and additionally on bottom surface 556. Lips 560 and apertures 552 optionally may be included on any surface that has recesses to accommodate additional connection. The lips and apertures assist in aligning the assemblies, while the geometry of the adjacent surfaces limit applied forces as will become apparent.

Figure 5E:
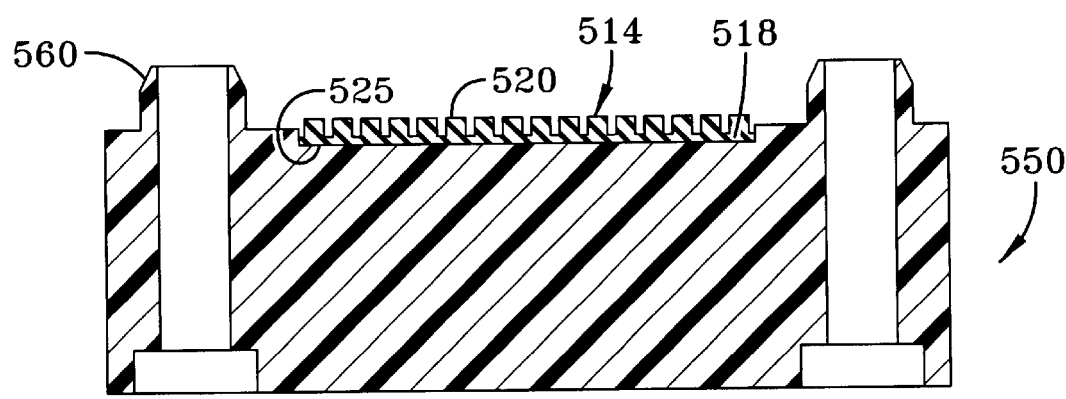
FIG. 5e is a cross-section of the compression assembly of FIG. 5d.

Referring now to FIG. 5e, a resilient compression mat 14, such as is shown in FIGS. 2a and 2b is assembled into recess 562 along top surface 554 of block 550. Mat 14 includes resilient cylinders 20 extending away from mat base 18. Recess 562 is dimensioned and toleranced to not only accept mat 14, but also to center mat 14 in the proper position along surface 554. Although not shown in this embodiment, it will be understood by those skilled in the art that optional recesses identical to recess 562 in each of side surfaces 555 parallel to the plane of FIG. 5e as noted above and bottom surface 556 may also accept a mat similar to mat 14. Mat 14 preferably is prefabricated with an adhesive 525 applied to mat base 18 on the side opposite resilient cylinders 20, so that a protective paper can be peeled from the adhesive and the prefabricated mat 14 can be assembled into recess of 562 of block 550 as required. Alternatively, adhesive may be applied to block 550 as needed and mat 14 may be applied to the adhesive. Threaded insert 570 is assembled into counterbore 564. Although shown in FIGS. 5a, 5b and 5e as an insert added to counterbore 564 in the preferred embodiment, the threaded insert may be molded into block 550 when block 550 is fabricated so as to be an integral part of block 550. In the preferred embodiment shown in FIGS. 5a, 5b, 5c, 5d, and 5e, recess 562 is present to accept mat 514 and presents a convenient means for positioning mat 514 along surface 554 or along the side surfaces 555. However, these recesses are not necessary as long as mat 514 can be accurately located along surface 554 so that resilient cylinders 20 are in a position against the portion of flexible substrate 506 opposite contacts 508 to urge contacts 508 against conductive pads 4 on rigid substrate 2 as shown in FIGS. 5a and 5b. Once compression assembly 512 which includes threaded insert 570 or equivalent is assembled by affixing resilient compression mat 514 onto connector block 550, flexible circuit compression connector system is assembled by attaching flexible substrate 506 to compression assembly 512. Flexible substrate 506 may be permanently affixed to compression assembly 512 by application of adhesive, if desired. As shown in FIGS. 5a and 5b, alignment apertures 526 in flexible substrate slides over lips 560 to properly align contacts 508 on flexible substrate 506 with compression cylinders 20 of flexible mat 14, compression cylinders 20 extending above surface 554 but below the top of lips 560, forming flexible circuit compression connector system 555. Rigid substrate 2 includes alignment apertures 28, the outer diameter of lips 560 being smaller than the diameter of alignment apertures 28. Flexible circuit compression connector system 555 is readily assembled to rigid substrate 2 by inserting lips 560 into alignment apertures 28. Threaded fasteners 580 having bearing surface 582 are assembled through alignment apertures 28 of rigid substrate 2 and apertures 552 to threadably engage threaded insert 570, so that the engagement urges bearing surface 582 into contact with rigid substrate 2, which in turn urges resilient cylinders 20 in compression assembly 512 against contacts 8 so that heads 10 of flexible circuit compression connector system 505 positively engage conductive pads 4 in the manner previously described. This geometry, in which the resilient cylinders 20 extend above surface 554 but below the top of lips 560, is selected to urge the contacts of the flexible substrate against the conductive pads. However, when appropriately dimensioned, it provides the additional advantage of self-limiting the resulting faces from the cylinders against the contacts on the flexible substrate, so that over tightening the circuit compression connector system against the rigid circuit board and thereby deforming the cylinders out of alignment with the contacts cannot occur.

Flexible substrates 6, 506, 806 and 906 include several embodiments that can be assembled to the compression assemblies of the present invention to produce a variety of flexible circuit compression connector systems suitable for various applications. In addition, more than one flexible substrate can be assembled to compression assembly 506 to provide a flexible circuit compression connector system with multiple connectivity capabilities.

Figure 6A:
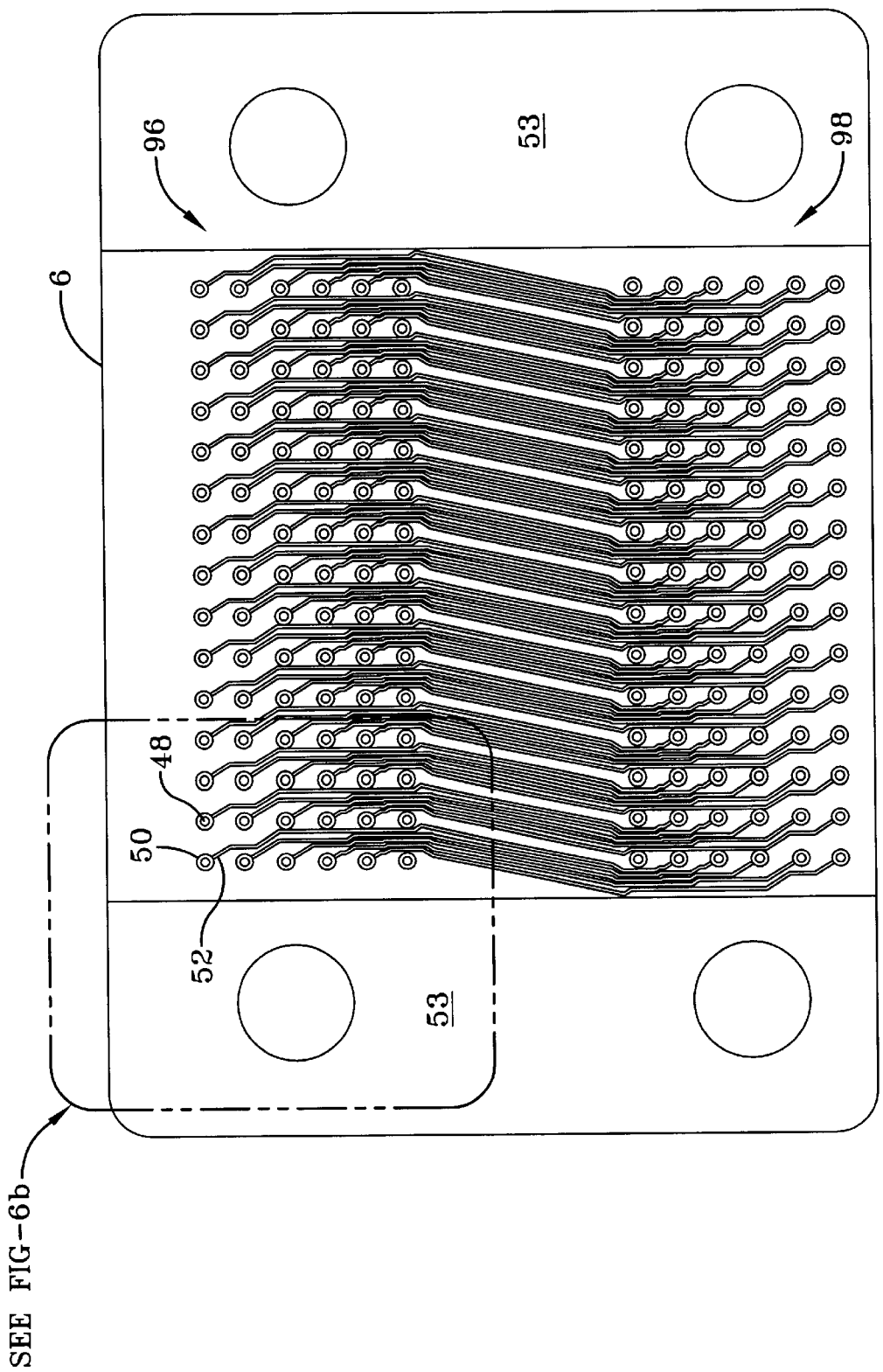
FIG. 6a is a plan view of one embodiment of a flexible substrate used in the compression connector of FIG. 1.
Figure 6B:
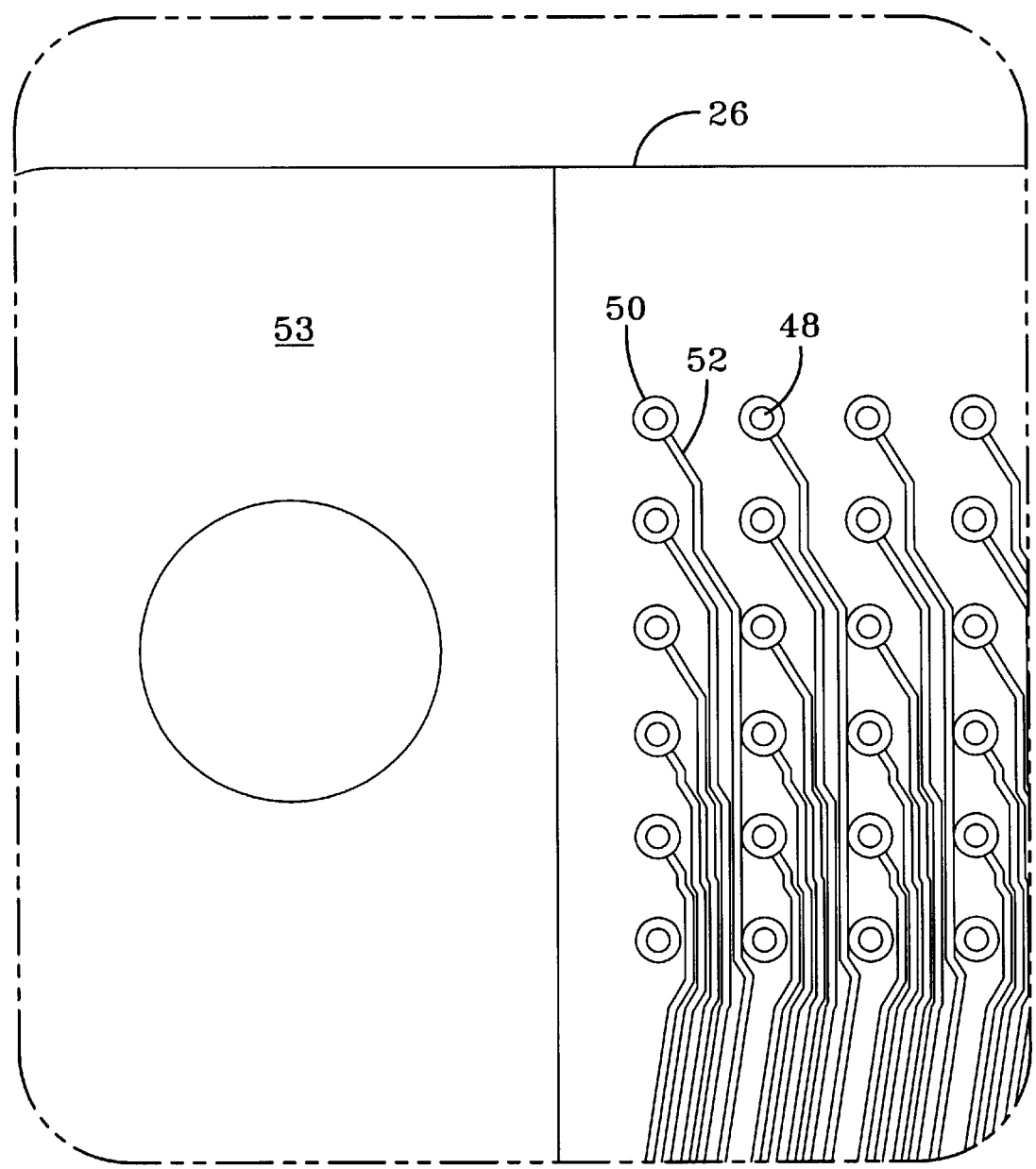
FIG. 6b is an enlarged view of a portion of FIG. 3a within line 3b.

With reference to FIGS. 6a–6b and with ongoing reference to FIGS. 1a–1b, flexible substrate 6 has a plurality of through-holes 48 formed therein that are adapted to receive the posts 44 of the contacts 8. The wall of each through-hole 48 includes metallization 50 formed therein to form a conductive through-hole. The metallization 50 in each through-hole 48 is preferably connected to a conductive line 52 or to one or more conductive ground planes 53 formed on the flexible substrate 6. The one or more conductive ground planes 53 are formed on one or both surfaces of the flexible substrate 6 to reduce or eliminate cross-talk between conductive lines 52 and/or to reduce or eliminate the effect on one or more of the conductive lines 52 of electromagnetic interference from external sources. The metallization 50 in each through-hole 48, the conductive lines 52 and the conductive ground planes 53 are formed on the flexible substrate 6 in a manner known in the art. To maintain post 44 of each contact 8 received in a through-hole 48, the metallization 50 of each through-hole 48 and the posts 44 of the contacts 8 received therein are fused together, preferably utilizing a solder 54.

In different embodiments, as shown in FIGS. 3b and 4, flexible substrate 806, 906 does not contain through holes 48 that extend through the flexible substrate. Rather, contacts 808, 908 are positioned on only one side of substrate 806, 906. Conductive ground planes and conductive lines 852, 952 are positioned on the same side of the substrate. Contacts 808, 908 are assembled to the flexible substrate in a similar manner; however in one embodiment, no posts are utilized. Referring now to FIGS. 3a and 3b, a flexible circuit having a pattern similar to the circuit shown in FIGS. 6a and 6b but without through holes, has contacts assembled to conductive metallic material 850 such as solder that is deposited at plurality of preselected locations corresponding to positions of metallization 50 such as is shown in FIG. 6a. Ground planes and conductive lines extend between at least two of such preselected locations. Contacts 808 include a base 840 and a head 810, but no post. Contacts are adhered to substrate 806 by bringing base 840 of contacts into alignment with conductive metallic material 850 and applying heat to adhere base 840 to metallic material. This can also be accomplished by reflow soldering, or alternatively by wave soldering, a well-known technique in which a wave of liquid solder is flowed over the substrate or if 850 is preapplied solder, by simply heating to liquify the solder.

In a variation of this embodiment as shown in FIG. 4, flexible substrate 906 includes recesses, depressions or cavities 948 which do not extend completely through substrate 906. Cavities 948 are located at a plurality of preselected locations corresponding to positions 50 such as is shown in FIG. 6a. Contacts 908 include a head 910, a base 940 and a post 944. The post is designed for assembly into cavity 948 and contacts are assembled to flexible substrate 906 by introducing a conductive metal such as solder 94 into cavity 948, thereby bonding contacts to flexible substrate 906 as previously described.

In still another variation which is a hybrid of the above-described embodiments, flexible substrate (not shown) includes a combination of through holes that extend through flexible substrate, such as through holes 48, and preselected positions for contacts and that are positioned on only one side of flexible substrate, the preselected positions for contacts and through holes forming an array in which the preselected positions for contacts and through holes occupy alternating positions on the array. With this configuration, conductive lines can be positioned on one side of the flexible substrate and can run between the contacts and conductive ground plans can be positioned on the opposite side of the substrate and can run between the through holes. Conductive lines extend between at least two of the contacts on one side of the opposite side of the flexible substrate. As will become apparent, the present invention allows for assembly of an array of contacts into positions on the array of through holes and preselected positions for contacts such that contacts at alternating positions will include a base, a head and a post that are secured to metallized through holes while adjacent contacts will include a base, a head and optionally a post that are secured to the preselected positions adjacent the through holes. In this configuration, although the density of the array of contacts remains the same, the circuitry is less dense since the conductive ground planes are positioned on one side of the flexible substrate, being connected by the contacts secured to the flexible through holes, while the conductive lines and its associated circuitry are located on the opposite side of the flexible substrate. Furthermore, there should be no problems with apertures in the substrate acting as electrical antenna and becoming sources of interference, as previously described, when the apertures only receive contacts connected to ground planes.

Figure 7A:
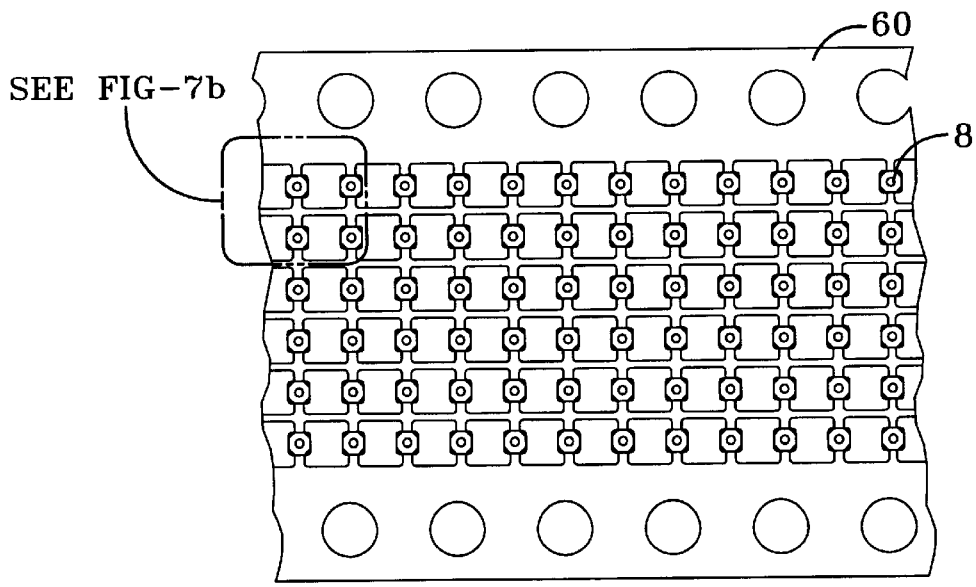
FIG. 7a is a plan view of a conductive strip that has been formed to include a plurality of contacts that are utilized in the compression connector of FIG. 1.
Figure 7B:
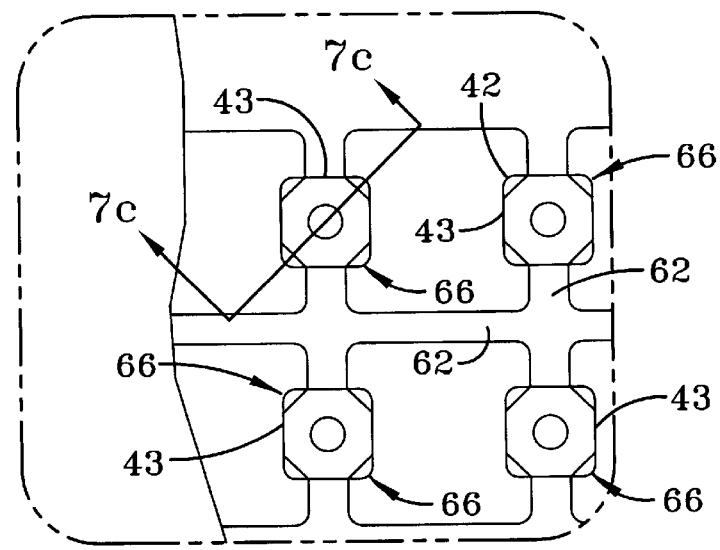
FIG. 7b is an enlarged view of a portion of the conductive strip of FIG. 7a within rectangle 7b.
Figure 7C:
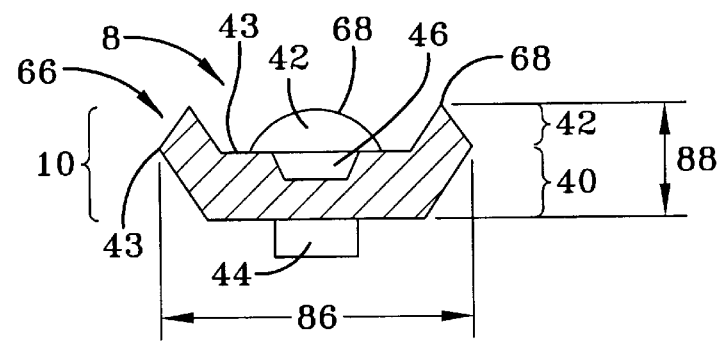
FIG. 7c is a cross section taken along lines 7c—7c in FIG. 7b.

The array of contacts that can be assembled to flexible substrate 6, 506, 806 and 906 include several different embodiments and combinations of these embodiments. Although the configuration of contacts may vary depending upon the particular characteristics of the circuit in which the flexible circuit compression connector system is to be used, the method of forming the contacts and assembling the contacts to flexible substrate is essentially the same. With reference to FIGS. 7a–7c, an array of contacts 8 having a preselected configuration is formed in a preferred embodiment by exposing a thin, flat strip 60 of conductive material to a stamping operation. The stamping operation also forms from the strip 60 a plurality of ribs 62 that extend between and secure together adjacent contacts. While the strip may be comprised of any conductive, deformable material, phosphor bronze, cartridge bronze and brass are preferred since they are inexpensive as well as conductive and deformable.

In one embodiment, each contact 808 is comprised of a base 840 that is substantially disk-shaped, and head 810 that is a smooth dome, the head projecting upward and inward from the disk edges as shown in FIGS. 3a and 3b. In another embodiment (not shown), each base is substantially rectangular and the head of each contact is formed of at least one micropyramidal knurl projecting upward from the base. The head may also have a shape of a disk, corresponding to the shape of conductive pad 4 located on circuit board 2. Such a head would be preferred if the material on the mating circuit board is thin and no problems with contamination are anticipated. If an aggressive contact is required because of anticipated problems with contamination such as oil, oxide formation or simply metal migration due to diffusion, an aggressive head configuration such as an inverted pyramid or diamond shape could be designed. In a preferred embodiment, the periphery 43 of the base 40 of each head 10 has a generally rectangular outline. Each corner 66 of the generally rectangular outline of the base 40 is rounded and includes one of the projections 42. Each projection 42 has a rounded edge 68 formed continuous with the periphery 43 of the base 40 as previously described.

As discussed above, depending upon the geometry of flexible substrate 6, 506, 806, 906, each contact in the array of contacts will include a head and a base, but may or may not include a post. Furthermore, if a post is included, the length of the post will depend upon whether flexible substrate includes through holes or recesses that do not extend through the substrate, or combinations thereof. The shape of the head may be any configuration that is achievable by metal working if a stamping operation is employed, the shape of the head is determined by the stamping die. The stamping die may include a variety of head shapes, so that the head shape may vary from position to position in the array. While contacts may be formed by etching the metal strip, the geometry is limited to simple profiles and lacks the flexibility that can be achieved by stamping.

Figure 8:
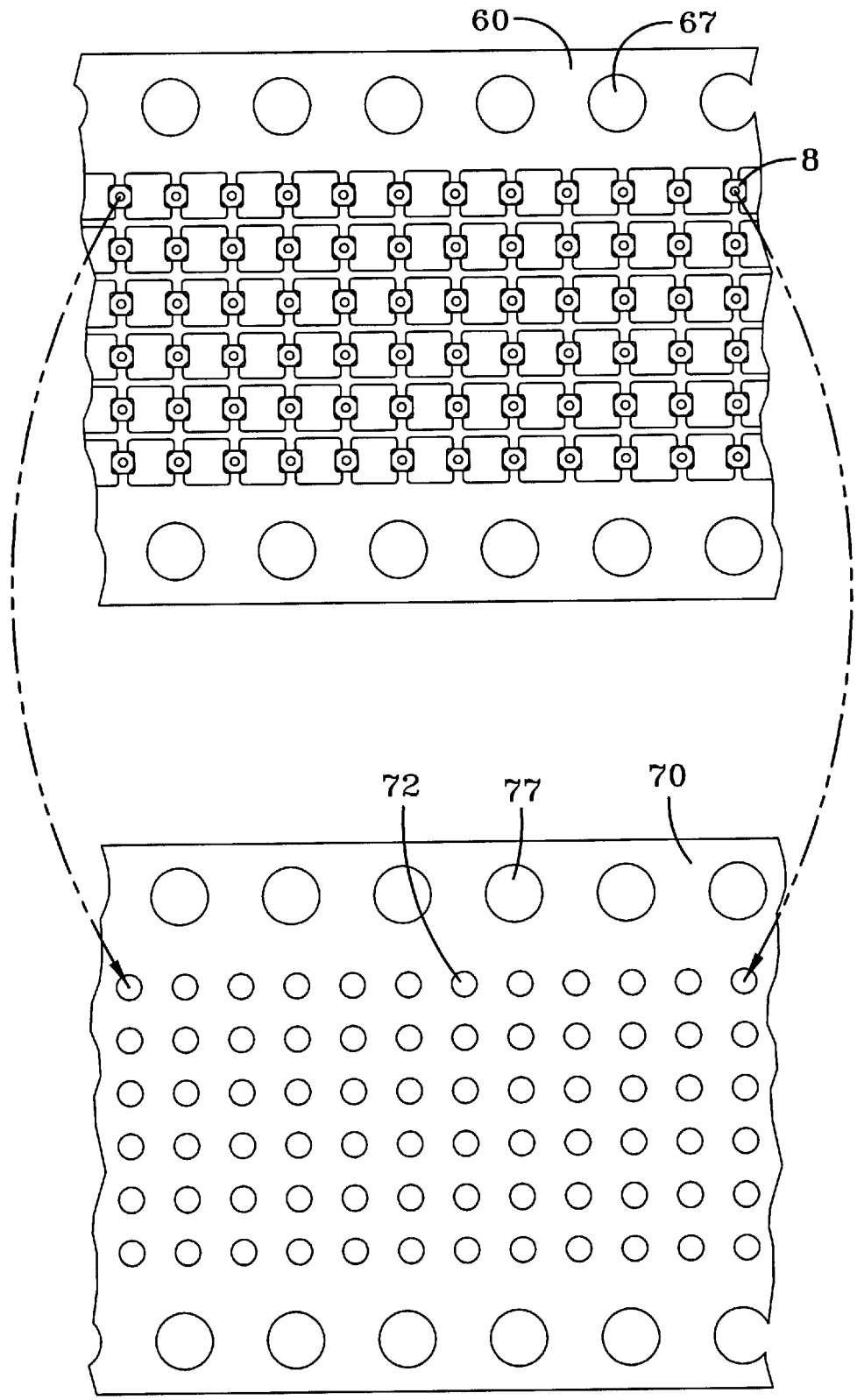
FIG. 8 is a plan view of the conductive strip of FIG. 7a aligned with a transfer film.

With reference to FIG. 8, a novel method for installing formed contacts 8 in a flexible substrate 6 is set forth. The array of formed contacts 8 having any of the desired configurations as set forth above are first transferred to a flexible transfer film 70, such as, Kapton® or Mylar. For illustration purposes only, the contact configuration is as set forth in FIG. 7c, it being understood by those skilled in the art that the contacts in the array may assume any desired shape, while the contacts in the array are connected to one another by thin ribs, also formed during the stamping operation. More specifically, strip 60 having an array of contacts 8 formed therein is aligned with the transfer film 70 so that each contact 8 is aligned in registration with one of a plurality of receiving apertures 72 in the transfer film 70. This is readily accomplished by aligning apertures 67 of strip with apertures 77 of transfer film. The apertures of the transfer strip are deformable and are slightly smaller than at least a portion of the contact in order to capture the contact. Although this process can be accomplished by any method, it is apparent that such alignment can be readily automated.

Figure 9A:
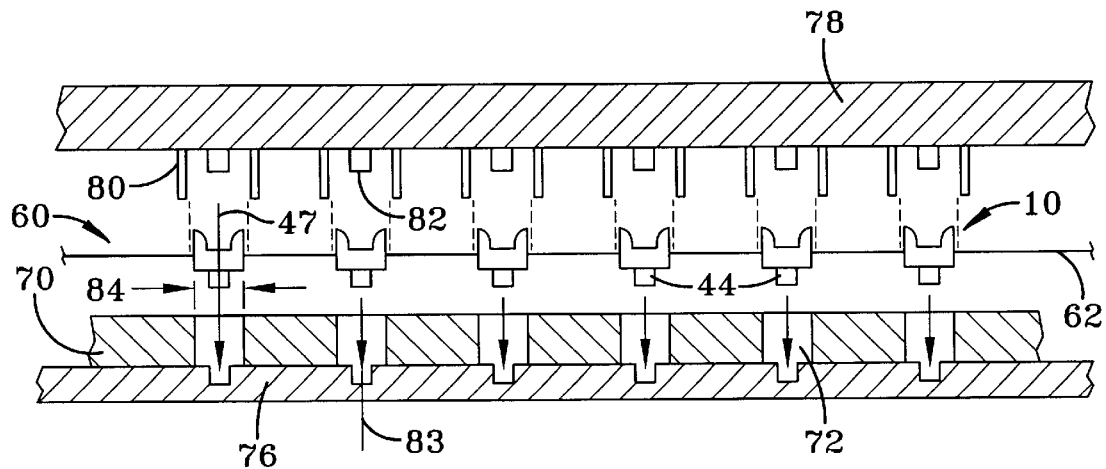
FIG. 9a is a cross-section of one configuration of an aligned conductive strip and transfer film of FIG. 8 positioned between a transfer base and an excising tool.

As shown in FIG. 9a for contacts containing a post, transfer film 70 containing contacts is positioned between strip 60 and a transfer base 76 so that the posts 44 of the contacts 8 are positioned in opposition with the transfer base 76 through the receiving apertures 72 of the transfer film 70. An excising tool 78 having a plurality of blades 80 and a plurality of push pins 82 is positioned on a side of the conductive strip 60 opposite the transfer film 70. In use, the excising tool 78 is moved towards the base 76 so that the blades 80 excise contacts 8 from ribs 62. The excised contacts 8 are then inserted into the receiving apertures 72 by push pins 82 so that the lengthwise axes 47 of the posts 44 are substantially coaxial with lengthwise axes 83 of the receiving apertures 72.

Figure 10:
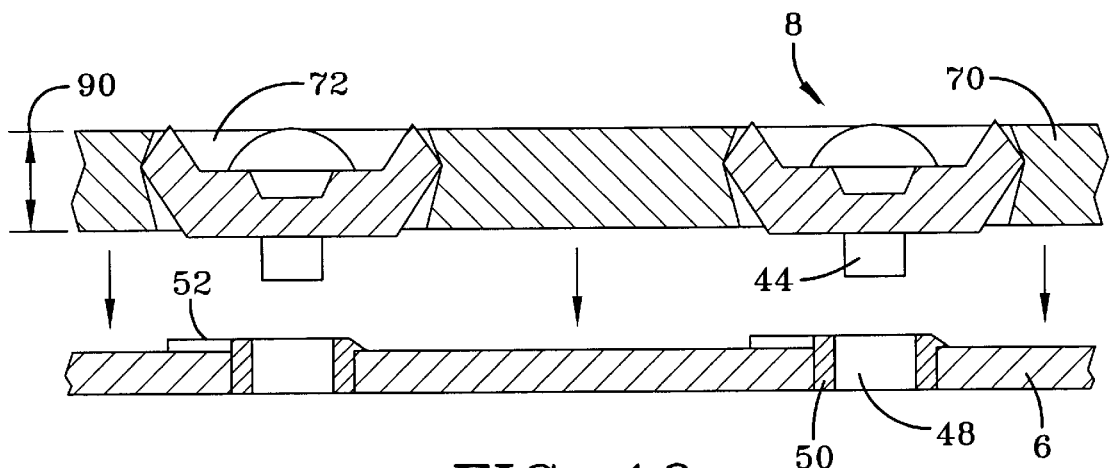

Before inserting the contacts 8, each receiving aperture 72 has a diameter 84 that is less than a diagonal distance 86 (shown in FIG. 7c) between opposite corners 66 of the base 40. As shown in FIG. 10, the receiving apertures 72 elastically deform to receive and secure the heads 10 of the contacts 8 therein. Preferably, each head 10 has a height 88 (shown in FIG. 7c) that is greater than a thickness 90 of the transfer film 70. Hence, when the heads 10 are inserted in the receiving apertures 72, the posts 44 of the contacts 8 are preferably positioned outside the receiving apertures 72. When the heads 10 are received in the receiving apertures 72, the transfer film 70 and the flexible substrate 6 are positioned so that the posts 44 are in registration with and receivable in the through-holes 48.

Figure 11:
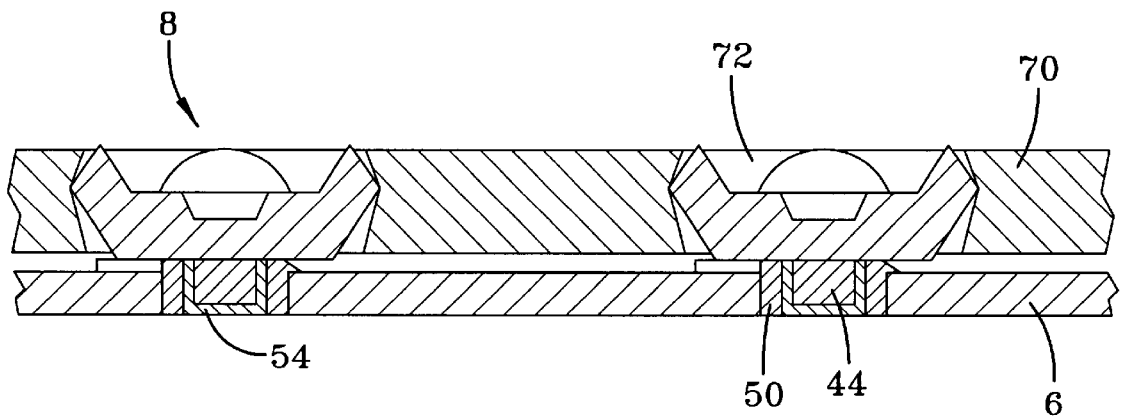
FIG. 11 is a cross section similar to FIG. 10 showing the transfer film and flexible substrate mated together with the posts of the contacts received within and soldered to the through-holes of the flexible substrate.

As shown in FIG. 11, the flexible substrate 6 and the transfer film 70 are brought together so that the posts 44 are received within the metallization 50 of the through-holes 48. The contacts 8 are secured to the flexible substrate 6 by fusing the posts 44 and the metallization 50 of the through-holes 48 together with the solder 54.

Figure 12:
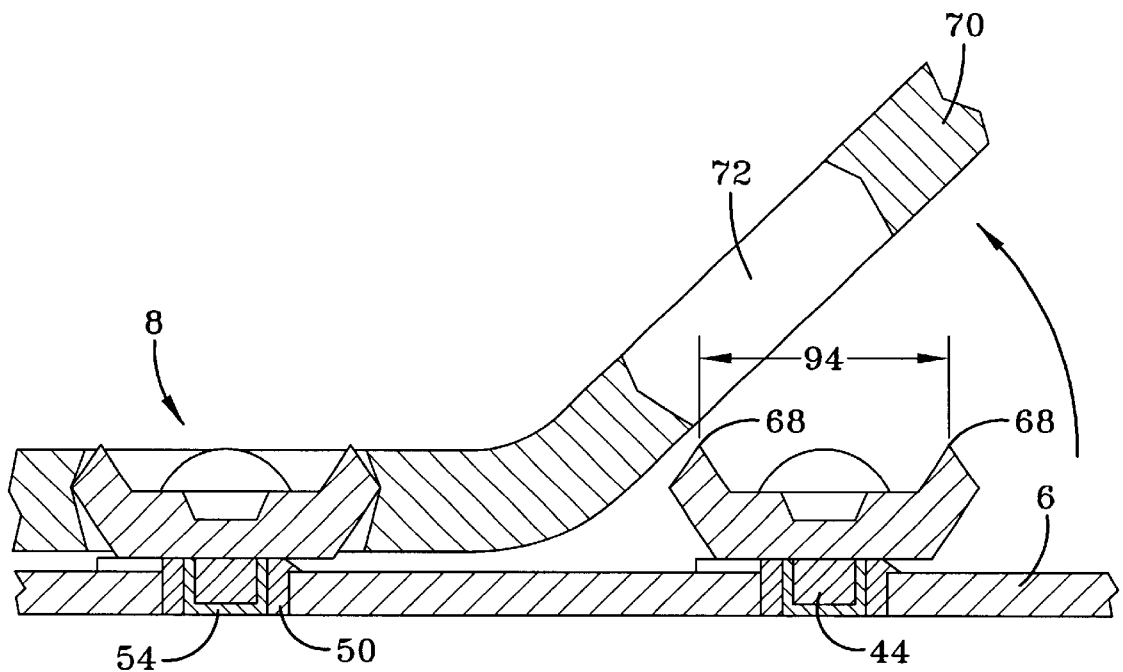
FIG. 12 is a cross section similar to FIGS. 10 and 11 and showing the separation of the transfer film from the flexible substrate and contacts.

As shown in FIG. 12, the flexibility of the transfer film 70 and the elastic deformability of the receiving apertures 72 enables the transfer film 70 to be separated, e.g., peeled away, from the contacts 8 secured to the flexible substrate 6. When the transfer film 70 is separated, the flexible substrate 6 and contacts 8 can be utilized in the manner described above in connection with FIGS. 1a–1b.

Figure 9B:
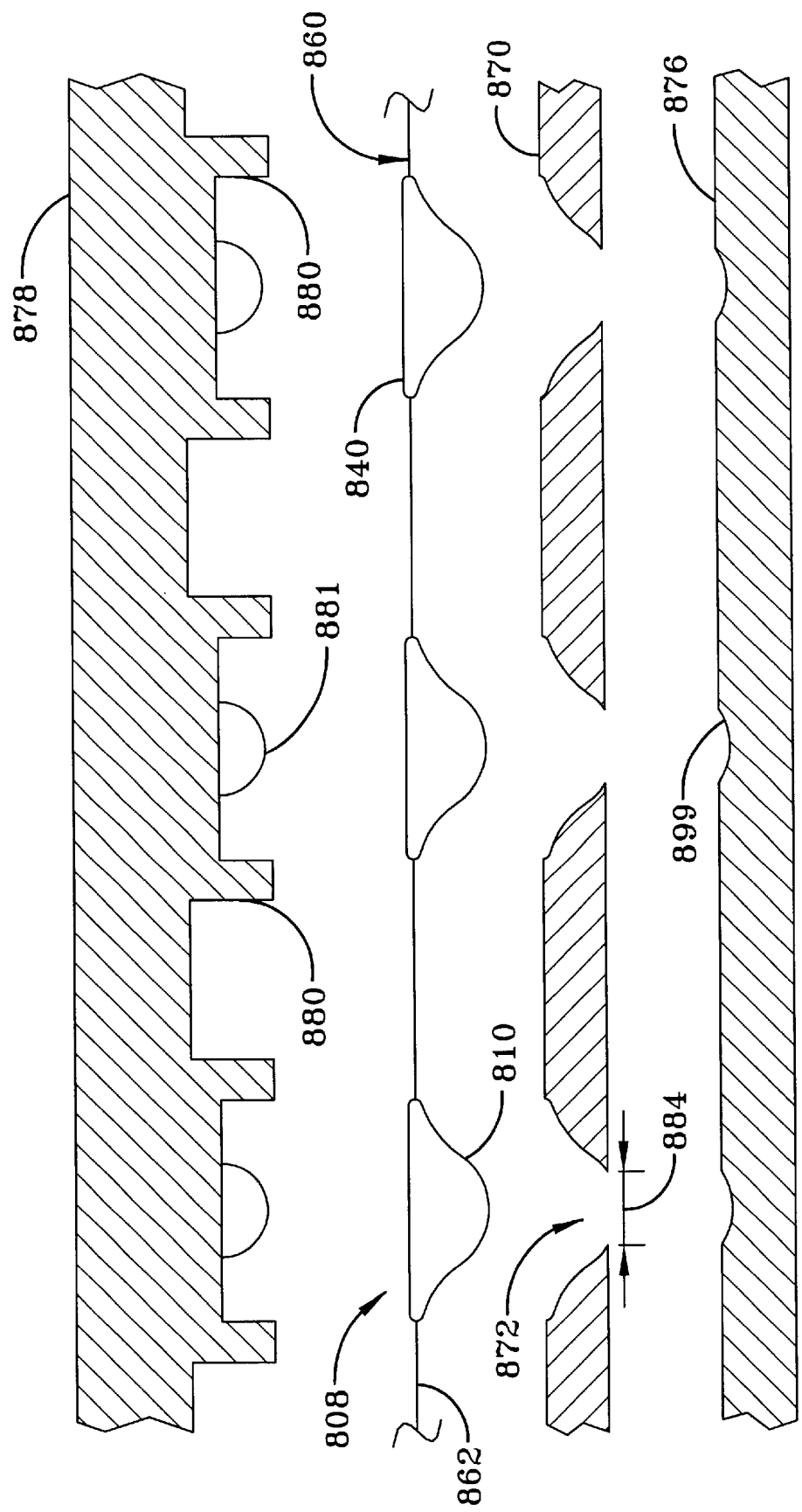
FIG. 9b is a cross-section of an alternative configuration of a conductive strip and transfer film of FIG. 8 positioned between a transfer base and an excising tool.

In the embodiment shown in FIG. 9b in which contact 808 includes a head 810 and a base 840, but no post, transfer film 870 is positioned between strip 860 and transfer base 876 so that head 810 of contacts 808 are positioned in opposition with receiving cavities 899 of transfer base 876 through receiving apertures 872 of transfer film 870 and heads are inserted through apertures 872. An excising tool 878 having a plurality of blades 880 is positioned on the side of conductive strip 860 opposite transfer film 870. Excising tool 878 includes a non-cutting urging projection 881 that urges strip 860 into contact with transfer film 870 and film 870 against transfer base 876. At least heads 810 of contacts 808 have a diameter greater than the diameter 884 of receiving apertures 872 of transfer film 870. Receiving apertures 872 of film 870 elastically deform to receive heads 810 as heads 810 are urged into receiving cavities 899 of transfer base 876 by urging projection 881. As excising tool 878 continues its motion toward transfer base 876, blades 880 of tool 878 excise contacts 808 from strip 870 by severing contacts 808 from ribs 862. Transfer film 870, now containing contacts 808 is removed from transfer base 876 and strip, is separated and removed from film 870. The ribs may be cut either before or after heads are urged into apertures 872. The design of the excising tool can permit severing the ribs without completely penetrating the film, after insertion of heads into apertures 872, or alternatively can sever the ribs prior to deformation of the film by heads, the final insertion being accomplished by push pins. With heads 810 in receiving apertures 872, transfer film 870 and flexible substrate 806 are positioned so that base 840 of contacts 808 projecting from film 870 on the side opposite heads 810 are in registration with the preapplied conductive material 850, solder paste, on flexible substrate 806, heads 810 of contacts 808 projecting outward or away from the interface of transfer film 870 and flexible substrate 806. Contacts 808 are secured to flexible substrate 806 in any conventional manner such as by reflow soldering. In this embodiment, when flexible substrate 806 utilizes preapplied solder paste at preselected positions, contacts 808 are secured to flexible substrate 806 by heating to liquify the solder. After the solder has cooled, transfer film 870 is readily removed, the film elastically deforming so as to be pulled away from the contact now secured to substrate by a metallic bond having a yield strength much higher than that of film 870. As shown in FIG. 6a by way of example, a first plurality 96 of through-holes 48 and a second plurality 98 of through-holes 48 are preferably disposed on opposite sides of the flexible substrate 6. When the contacts 8 are fused into the first and second plurality 96, 98 of through-holes 48, the side of the flexible substrate 6 adjacent the first plurality 96 of through-holes 48 can be utilized to connect to one rigid substrate (not shown) and the side of the flexible substrate 6 adjacent the second plurality 98 of through-holes 48 can be utilized to connect to another rigid substrate (not shown) thereby effecting electrical connection between the rigid substrates.

In another embodiment, each post 44 has a diameter between 7 and 8 mils and a length of 2 mils. The head 30 of each contact 8 has a height of 10 mils and the cavity 46 has a depth of 3 mils. The height of each projection 42 is 4 mils and a distance 94 (shown in FIG. 12) between rounded edges 68 of projections 42 on diagonally opposite corner 66 is 21.5 mils. The strip 60 and contacts 8 are formed from a strip of ¼ hard brass. The contacts 8 are plated with 5 micro-inches of soft gold over 30 micro-inches of palladium nickel over 50 micro-inches of sultanate nickel. The conductors 52 and the ground planes 53 of the flexible substrate 6 are formed from ½ ounce copper which is deposited as a sheet on the flexible substrate 6 and then patterned and etched utilizing photolithographic and etching techniques known in the art. Based on the foregoing, it can be seen that the contacts 8 are sufficiently small so that manual manipulation of contacts 8 into the through-holes 48 of the flexible substrate 6 is not practical. To this end, and in accordance with the present invention, forming the array of contacts 8 from the strip 60 enables the contacts 8 to be manipulated as an array. Similarly, the transfer film 70 enables the contacts 8 to be transferred as an array from the strip 60 to the flexible substrate 6. The transfer film 70 also helps maintain contacts 8 in communication with conductive metal on the flexible substrate during fusing of the contacts to the metallization 50 of substrate 6, the metallization being preapplied solder on one side of the substrate, or metallization in cavities on the substrate or metallized through holes so that a strong metallic bond can be formed. Hence, the contacts 8 are manipulated as an array from the time they are formed from the strip 60 in the stamping operation until they are fused onto the conductive metallization on the flexible substrate 6. This manipulation of the contacts 8 as an array enables the flexible circuit compression connector system of the present invention to be manufactured efficiently and cost effectively. Moreover, the compression connector of the present invention avoids the prior art teaching of plating contacts on the flexible substrate, and permits the use of a variety of flexible substrates.

Because the metallization 50 at preselected locations on the flexible substrate and the conductive lines 52 are preformed on the flexible substrate 6, it is preferable to avoid soldering the contacts 8 to the metallization prior to excising the contacts from the ribs 62 due to concerns over cutting with the blades 80 of the excising tool 78 the conductive lines 52 or the metallization 50 in the through-holes 48. Hence, the contacts 8 are first transferred to the flexible transfer film 70 which is utilized to transfer the contacts 8 to the flexible substrate 6 and which may thereafter be disposed as justified by the condition thereof.

While not described in the above embodiments, the contacts can alternatively be formed by depositing conductive metal directly onto the transfer film, the transfer film including cavities of preselected configuration corresponding to the required head, base and optional post geometry. In this embodiment, no ribs are formed and the operation for excising ribs is eliminated.

The various configurations of contacts of the present invention are believed to provide over prior art systems improved contact with contact pads 4 on the rigid substrate 2. Generally, the compression assembly system when used with the flexible substrate forms a flexible circuit compression connector system that provides improved contact between the contact matrix on the flexible substrate and the contact pads on the rigid substrate due to the constant spring force applied by the compression mat to the contact matrix on the flexible substrate. Furthermore, the circuit compression connector system of the present invention permits repeated assembly and disassembly of the flexible substrate to the rigid substrate with no deterioration in electrical performance at the interface, as the system relies on the constant spring force of the resilient mat to provide the contact force, and not on deformation of header or receptacle elements. A variety of head configurations for the flexible circuit compression connector system can be made available for various applications confronted by the designer or engineer. Specifically, in one configuration, the rounded edge 68 of each projection 42 contacting one of the contact pads 4 cuts through oils or films that may be present on the conductive pad 4 and/or the contact 8 prior to mating, thereby enabling conductive paths to be formed between each projection 42 in contact with the conductive pad 4. However, less aggressive head designs such as disks or hemispherical configurations can be utilized when there is concern about the integrity of the resulting connection because of thin metal. However, more aggressive configurations can be utilized if there are concerns with contamination or diffusion problems. In the preferred configuration, the flexible circuit compression connector system comprises a connector block assembly and at least one flexible substrate. This connector block assembly can be provided as original equipment with a plurality of flexible cables for multiple connectivity, or can be readily modified at any time, such as in the field to accommodate additional flexible cables to provide for added connectivity as the need arises.

As can be seen from the foregoing, the present invention provides a flexible circuit compression connector system that promotes electrical contact with a conductive pad of a printed circuit board. The flexible circuit compression connector system of the present invention can incorporate a number of contact configurations suitable for varying conditions that may be experienced. The invention also permits the incorporation of multiple flexible cables at any time without the need to replace existing connector system. The present invention also provides a method for making a flexible circuit compression connector system for use as a circuit connector that utilizes the provided compression assembly to provide improved contact with a mating circuit connection and is less costly to manufacture than the prior art flexible circuit connectors.

The invention has been described with reference to the preferred embodiment. Obvious modifications and alterations will occur to others upon reading and understanding the preceding specification. It is intended that the invention be construed as including all such modifications and alterations insofar as they come within the scope of the appended claims or the equivalents thereof.

What is claimed is:

1. A method for forming a flexible circuit compression connector system including a plurality of contacts at preselected positions, the contacts including at least a base and a head of preselected configuration, comprising the steps of:

providing a flexible insulating substrate;

applying conductive material to the substrate at a plurality of preselected positions;

extending at least one conductive line between at least two of the preselected positions;

providing a transfer film of deformable material containing an array of apertures, each aperture including a contact having at least a base and a head of preselected configuration, the apertures being smaller than the contacts, the array positioned so that at least the portion of each contact opposite the head is alignable with the preselected positions of conductive material on the flexible insulating substrate;

placing the transfer film against the flexible substrate so that portions of the contacts opposite the heads abut the preselected positions of conductive material on the flexible substrate, while the heads project away from the flexible substrate;

fusing the conductive material to the portion of the contacts opposite the heads; and following the fusing, separating the transfer film from the flexible substrate and the contacts, so that the heads of the contacts project away from the substrate.

2. The method of claim 1 wherein the step of providing a transfer film of deformable material having apertures and contacts further includes the additional steps of:

providing a strip of metallic material of sufficient thickness for metal forming;

forming the strip of metallic material into an array of contacts and thin connecting ribs, each contact having at least a base and a head of preselected configuration connected to the base, each contact attached to the adjacent contact by the thin ribs, the contacts in the array positioned so that at least the base of each contact is alignable with the preselected positions of conductive material on the flexible insulating substrate;

providing a transfer film of deformable material containing an array of apertures, the apertures being smaller than the contacts, the array of apertures positioned so that each aperture is alignable with each contact on the formed metallic strip;

aligning the contacts of the strip with the apertures of the transfer film;

urging the transfer film and the strip together so that the contacts are forced into the apertures, thereby deforming the apertures so that the film captures the contacts while severing the thin ribs between the contacts; and removing the ribs from the film containing the contacts.

3. The method of claim 2 in which the strip is formed into an array of contacts of preselected configuration and thin ribs by stamping.

4. The method of claim 3 wherein the preselected configuration of the head of at least one contact formed by stamping is in the shape of a dome projecting away from the base.

5. The method of claim 3 wherein the preselected configuration of the head of at least one contact formed by stamping is a flat profile on a side of the head opposite the base.

6. The method of claim 3 wherein the preselected configuration of the head of at least one contact formed by stamping is in the shape of a disk.

7. The method of claim 3 wherein the preselected configuration of the head of at least one contact formed by stamping is in the shape of an inverted truncated pyramid.

8. The method of claim 3 wherein the preselected configuration of the head of at least one contact formed by stamping is in the shape of an inverted truncated cone.

9. The method of claim 3 wherein the preselected configuration of the head of at least one contact formed by stamping includes at least one knurl-shaped inverted micropyramidal shaped projection, the tip of the pyramid projecting away from the base.

10. The method of claim 3 wherein the preselected configuration of the head of at least one contact formed by stamping includes at least one diamond shaped projection, the tip of the diamond projecting away from the base.

11. The method of claim 1 in which the contacts are fused to the conductive material by application of heat.

12. The method of claim 1 in which the contacts are fused to conductive material by soldering.

* * * * *